US011596053B2

(12) United States Patent
Files et al.

(10) Patent No.: US 11,596,053 B2
(45) Date of Patent: Feb. 28, 2023

(54) PARALLEL PRINTED CIRCUIT BOARD ASSEMBLY

(71) Applicant: Dell Products L.P., Round Rock, TX (US)

(72) Inventors: Jace W. Files, Round Rock, TX (US); John T. Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 151 days.

(21) Appl. No.: 17/077,610

(22) Filed: Oct. 22, 2020

(65) Prior Publication Data

US 2022/0132650 A1    Apr. 28, 2022

(51) Int. Cl.
*H05K 1/02* (2006.01)
*H05K 1/14* (2006.01)
*H05K 3/36* (2006.01)

(52) U.S. Cl.
CPC ........... *H05K 1/0203* (2013.01); *H05K 1/023* (2013.01); *H05K 1/142* (2013.01); *H05K 3/368* (2013.01)

(58) Field of Classification Search
CPC .................. H01L 23/427; H01L 25/00; H01L 2224/16225; H01L 2924/19105; H01L 2924/00; H01L 2924/0002; H05K 1/0203; H05K 1/142; H05K 1/02; H05K 1/14; H05K 3/368; H05K 3/36; H05K 7/20809; H05K 7/20336; H05K 9/0024; H05K 1/023
USPC .................................. 361/721, 704; 220/4.01
See application file for complete search history.

(56) References Cited

U.S. PATENT DOCUMENTS

| 5,784,263 A * | 7/1998 | Nelson ................. H01R 12/721 439/328 |
| 2012/0152942 A1* | 6/2012 | Chen ..................... H01L 23/427 220/4.01 |
| 2016/0049240 A1* | 2/2016 | Kato ........................ H01G 4/14 361/748 |
| 2019/0113288 A1* | 4/2019 | Cheng ................. F28D 15/0283 |

(Continued)

FOREIGN PATENT DOCUMENTS

| CN | 210892824 U * | 6/2020 | ............. F28D 15/04 |
| KR | 101846203 B1 * | 4/2018 | ............... C09K 5/14 |

*Primary Examiner* — Timothy J Thompson
*Assistant Examiner* — Guillermo J Egoavil
(74) *Attorney, Agent, or Firm* — McDermott Will & Emery LLP

(57) ABSTRACT

A printed circuit board (PCB) assembly with a first PCB connected to a second PCB with a flexible interconnect and a vapor chamber for positioning between the first PCB and the second PCB. The flexible interconnect allows the PCB assembly to be in an open configuration or a closed configuration. In the closed configuration, the vapor chamber is between the two PCBs. The flexible interconnect supplies a portion of the electric power from the first PCB to the second PCB and a power connector supplies a second portion of the electric power. Grounding springs allow localized grounding of the PCB assembly. The flexible interconnect, the power connector and the grounding springs provide structural support for the second PCB. The vapor chamber may be longer than the PCBs to draw heat away from components and the flexible interconnect may be used as an airflow guide for improving airflow over components.

20 Claims, 5 Drawing Sheets

(56) References Cited

U.S. PATENT DOCUMENTS

2020/0144223 A1\* 5/2020 Tamayama ......... H05K 7/20809
2022/0228437 A1\* 7/2022 Caillat .................... E06B 9/174

\* cited by examiner

PARALLEL PRINTED CIRCUIT BOARD ASSEMBLY

BACKGROUND

Field of the Disclosure

This disclosure relates generally to information handling systems and, more particularly, to printed circuit boards (PCBs) and methods for cooling printed circuit boards.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Printed circuit boards (PCBs) contain the components for processing information by an information handling system. Multiple components on a PCB generate heat and require cooling, with each component possibly having a different height. Furthermore, some components are affected by interference and require shielding or grounding.

SUMMARY

Components of information handling systems are continuously being developed to perform at higher speeds, generating higher temperature levels within the chassis of the information handling system. As the designs of information handling systems, particularly portable information handling systems, get thinner and lighter, system and component architecture must provide adequate airflow through the chassis to cool the components on PCBs.

Embodiments disclosed herein may be generally directed to printed circuit board (PCB) assemblies comprising two printed circuit boards coupled by a flexible interconnect wherein at least a portion of one printed circuit board overlaps the other printed circuit board.

Embodiments disclosed herein may be directed to a method of manufacturing a printed circuit board (PCB) assembly. Manufacturing a PCB assembly may comprise forming a first printed circuit board with a first plurality of components, a power cable connector configured to receive electric power, a communications connector and a first part of a power connector; forming a second printed circuit board with a second plurality of components and a second part of the power connector; coupling a first side of a flexible interconnect to the first printed circuit board and a second side of the flexible interconnect to the second printed circuit board; positioning a vapor chamber relative to the first printed circuit board; and rotating the second printed circuit board relative to the first printed circuit board to configure the PCB assembly in a closed configuration. In the closed configuration, the flexible interconnect is configured to supply a first portion of the electric power from the first printed circuit board to the second printed circuit board and configured to transmit communications between the first printed circuit board and the second printed circuit board. In the closed configuration, the vapor chamber is positioned between the first printed circuit board and the second printed circuit board. In the closed configuration, the first portion of the power connector contacts the second part of the power connector to enable supplying a second portion of the electric power from the first printed circuit board to the second printed circuit board.

A connection between the first printed circuit board and the second printed circuit board may be configured to maintain a minimum distance between the first printed circuit board and the second printed circuit board and to accommodate a vapor chamber. A vapor chamber may be formed with one or more bends or cutouts based on a component of the first plurality of components or the second plurality of components. The vapor chamber may be longer than one or more of the first printed circuit board and the second printed circuit board to extend into an airflow and may have fins for improved heat transfer to the airflow.

A first end of a first grounding spring may be coupled to the first printed circuit board, wherein, in a closed configuration, a second end of the grounding spring contacts the vapor chamber to provide localized grounding or otherwise shortens a path to ground. A first end of a second grounding spring may be coupled to the second printed circuit board, wherein, in a closed configuration, a second end of the grounding spring contacts the vapor chamber to provide localized grounding or otherwise shortens a path to ground. One or more of the first grounding spring and the second grounding spring may be configured to maintain a minimum distance between the first printed circuit board and the second printed circuit board.

A first part of a retention feature may be coupled to the first printed circuit board and a second part of the retention feature may be coupled to the second printed circuit board, wherein rotating the second printed circuit board relative to the first printed circuit board engages the first part of the retention feature with the second part of the retention feature to engage the first printed circuit board and the second printed circuit board in a closed configuration. The retention feature may maintain a separation distance between the first printed circuit board and the second printed circuit board. The retention feature may maintain a maximum separation distance and a power connector may maintain a minimum distance between the first printed circuit board and the second printed circuit board, wherein the retention feature and the power connector maintain a separation distance between the first printed circuit board and the second printed circuit board.

Embodiments may utilize the flexible interconnect as an airflow guide, wherein the flexible interconnect and a second airflow guide opposite the flexible interconnect guide airflow between the first printed circuit board and the second printed circuit board along a length of a PCB assembly.

BRIEF DESCRIPTION OF THE DRAWINGS

For a more complete understanding of the invention and its features and advantages, reference is now made to the following description, taken in conjunction with the accompanying drawings, in which.

DESCRIPTION OF PARTICULAR EMBODIMENT(S)

Figure 1:
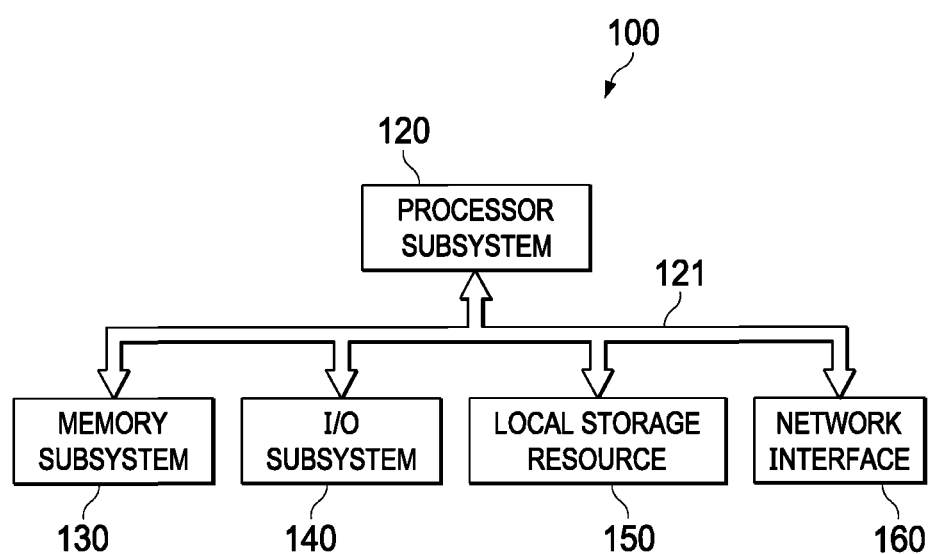
FIG. 1 is a block diagram of selected elements of an embodiment of an information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

As used herein, a hyphenated form of a reference numeral refers to a specific instance of an element and the un-hyphenated form of the reference numeral refers to the collective or generic element. Thus, for example, component "204-1" refers to an instance of an application, which may be referred to collectively as components "204" and any one of which may be referred to generically as component "204."

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and one or more video displays. The information handling system may also include one or more buses operable to transmit communication between the various hardware components.

Embodiments disclosed herein are described with respect to resources associated with bulk data requests but may also be practiced with other resources. Particular embodiments are best understood by reference to FIGS. 1-2, 3A-3B, 4 and 5, wherein like numbers are used to indicate like and corresponding parts.

Turning to the drawings, FIG. 1 illustrates a block diagram depicting selected elements of an embodiment of information handling system 100. It is noted that FIG. 1 is not drawn to scale but is a schematic illustration.

As shown in FIG. 1, components of information handling system 100 may include, but are not limited to, a processor subsystem 120, which may comprise one or more processors, and a system bus 14 that communicatively couples various system components to processor subsystem 120 including, for example, a memory subsystem 130, an I/O subsystem 140, local storage resource 150, and network interface 160.

Processor subsystem 120 may comprise a system, device, or apparatus operable to interpret and execute program instructions and process data, and may include a microprocessor, microcontroller, digital signal processor (DSP), application specific integrated circuit (ASIC), or another digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

System bus 121 may refer to a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and transmit data to or from or within information handling system 100. I/O subsystem 140 may represent, for example, a variety of communication interfaces, graphics interfaces, video interfaces, user input interfaces, and peripheral interfaces. In various embodiments, I/O subsystem 140 may be used to support various peripheral devices, such as a touch panel, a display adapter, a keyboard, a touch pad, or a camera, among other examples. In some implementations, I/O subsystem 140 may support so-called 'plug and play' connectivity to external devices, in which the external devices may be added or removed while information handling system 100 is operating.

Local storage resource 150 may comprise computer-readable media (e.g., hard disk drive, floppy disk drive, CD-ROM, and other type of rotating storage media, flash memory, EEPROM, or another type of solid-state storage media) and may be generally operable to store instructions and data.

Network interface 160 may be a suitable system, apparatus, or device operable to serve as an interface between information handling system 100 and a network (not shown). Network interface 160 may enable information handling system 100 to communicate over a network using a suitable transmission protocol or standard. In some embodiments, network interface 160 may be communicatively coupled via a network to a network storage resource (not shown). A network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), or any combination thereof. A network coupled to network interface 160 or various components associated therewith may be implemented using hardware, software, or any combination thereof.

Embodiments disclosed herein include printed circuit board (PCB) assemblies for use in information handling systems 100 including portable information handling systems 100. In some embodiments, a printed circuit board may be a motherboard configured with components of processor subsystem 120 such as a central processing unit (CPU) as well as other components such as memory controllers associated with memory subsystem 130, controllers for peripheral devices in I/O system 20 and interface connectors or controllers for communicating over network 22.

Figure 2:
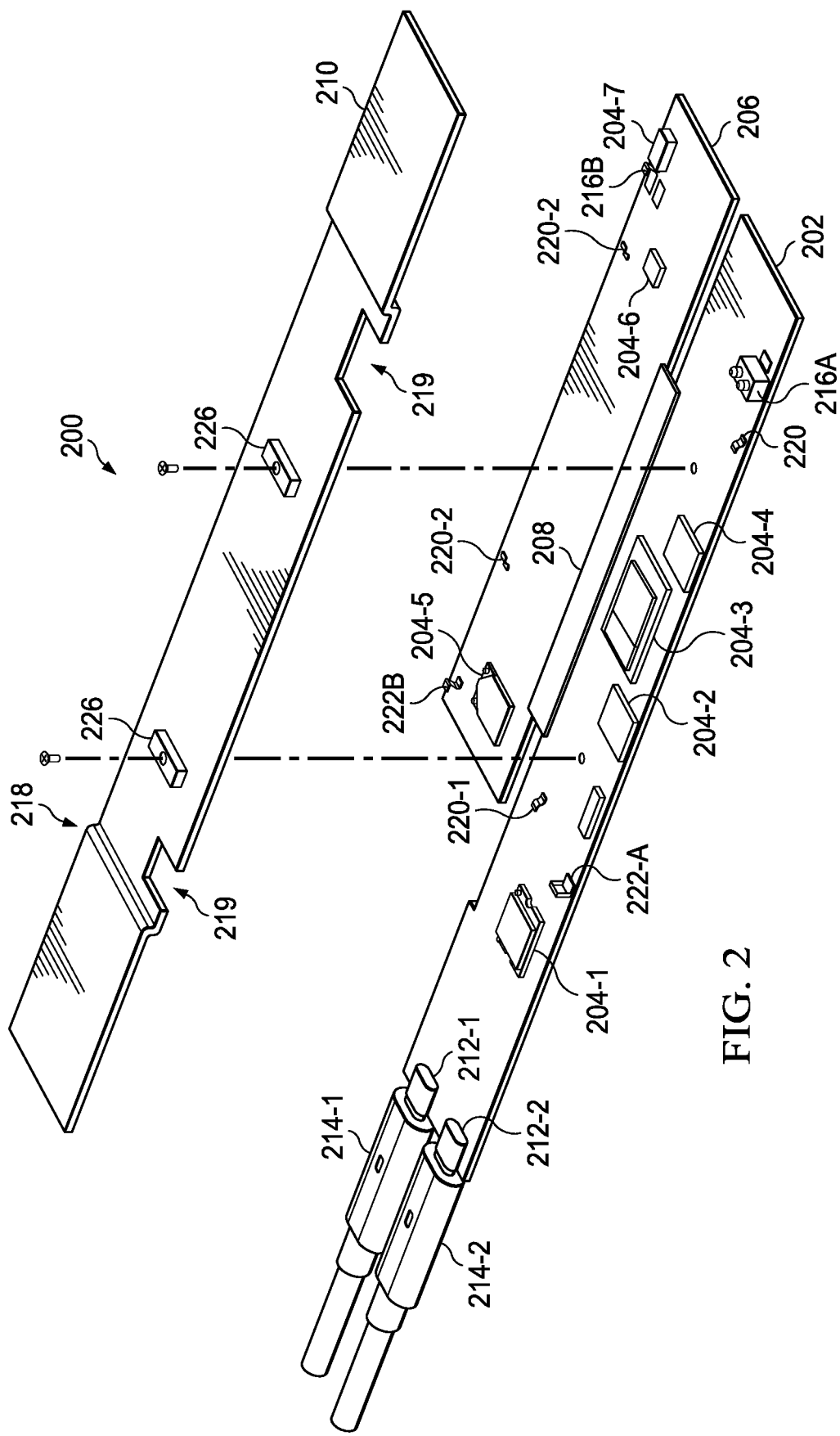
FIG. 2 is an exploded view of one embodiment of a PCB assembly with a flexible interconnect.
Figure 3A:
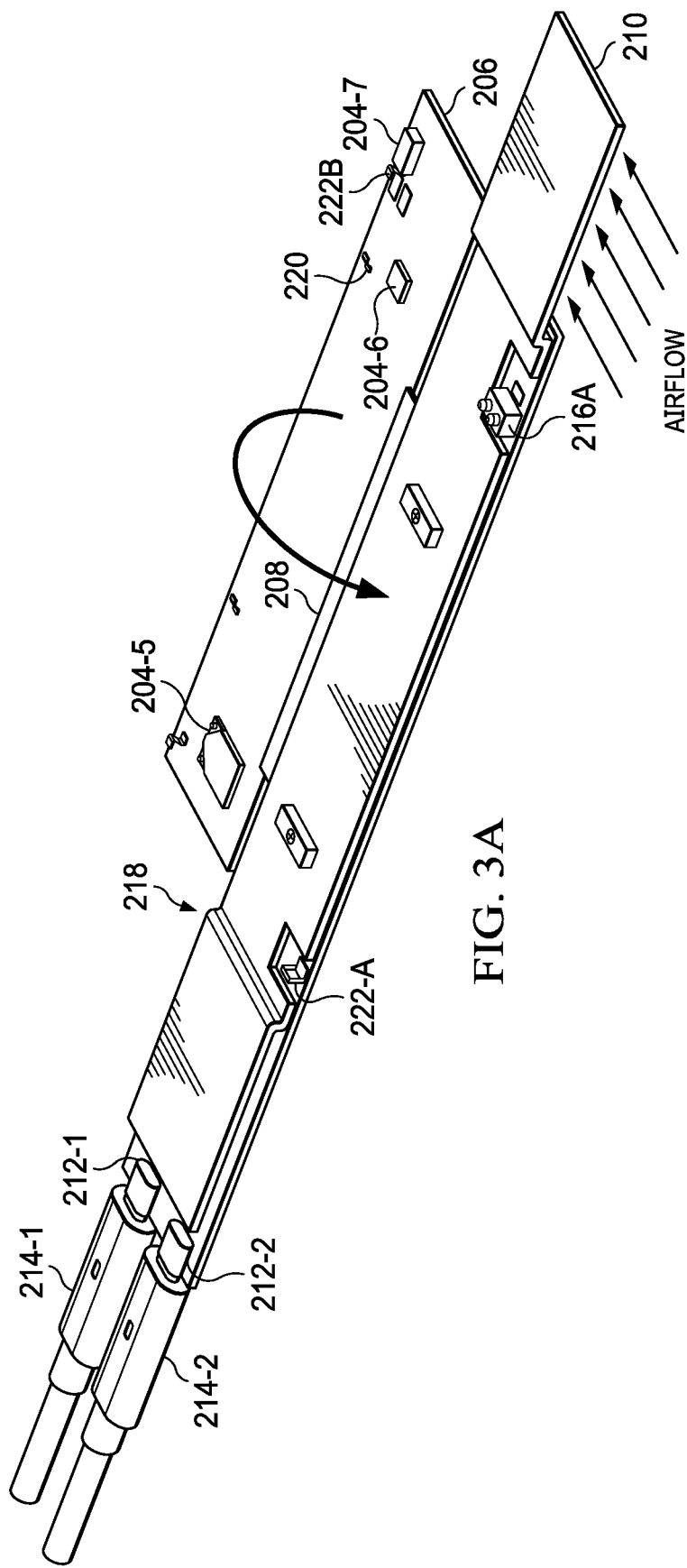
FIGS. 3A and 3B are perspective and side views, respectively, of the embodiment of a PCB assembly depicted in FIG. 2.
Figure 3B:
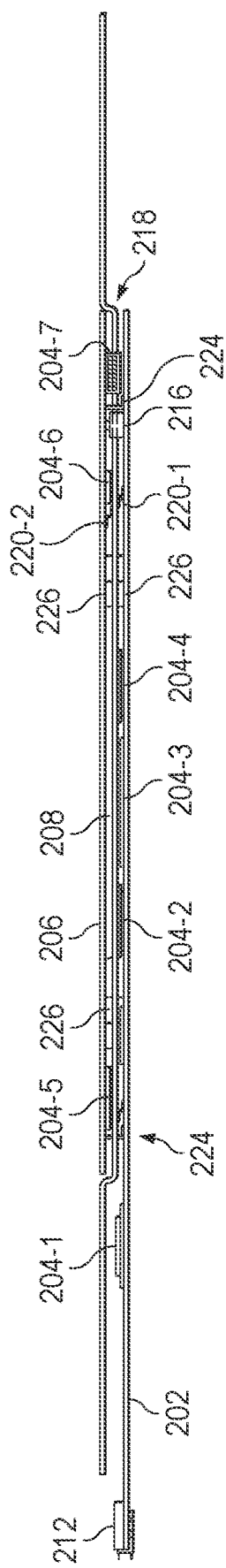

Embodiments disclosed herein may include PCB assemblies that are configurable such that a portion of a first printed circuit board overlaps a second printed circuit board and is maintained at a separation distance to accommodate a vapor chamber. Referring to FIGS. 2, 3A and 3B, PCB assembly 200 comprises first printed circuit board 202 with a first set of components 204, second printed circuit board 206 with a second set of components 204, flexible interconnect 208 coupling second printed circuit board 206 with first printed circuit board 202, and vapor chamber 210 for removing heat from components 204 on first printed circuit board 202 and second printed circuit board 206.

First printed circuit board 202 and second printed circuit board 206 each have a set of components 204 for processing information and providing functionality associated with information handling system 100. For example, components 204 may form part of processor subsystem 120, part of memory subsystem 130, part of I/O subsystem 140, part of local storage resource 150 and part of network interface 160 of information handling system 100. In some embodiments, first printed circuit board 202 and second printed circuit board 206 comprise portions of a motherboard, wherein the performance of processes and the functionality of the motherboard are divided between first printed circuit board 202 and second printed circuit board 206.

A method of manufacturing PCB assembly 200 may include forming vapor chamber 210 based on components 204 on first printed circuit board 202 and second printed circuit board 206 (as depicted in FIG. 2), coupling vapor chamber 210 to first printed circuit board 202 in an open configuration (such as the open configuration depicted in either of FIGS. 2 and 3A), and rotating second printed circuit board 206 relative to first printed circuit board 202 to position vapor chamber 210 between first printed circuit board 202 and second printed circuit board 206 in a closed configuration (such as the closed configuration depicted in FIG. 3B).

As used herein, an open configuration may refer to a configuration in which first printed circuit board 202 and second printed circuit board 206 do not overlap and are positioned facing the same direction. In an open configuration, second printed circuit board 206 may receive electric power and communications from first printed circuit board 202 via flexible interconnect 208 but not via power connector 216 and second printed circuit board 206 may be grounded to first printed circuit board 202 via flexible interconnect 208 but not via grounding springs 220.

As used herein, a closed configuration may refer to a configuration in which second printed circuit board 206 is rotated relative to first printed circuit board 202 to position second printed circuit board 206 over first printed circuit board 202 with vapor chamber 210 positioned between first printed circuit board 202 and second printed circuit board 206. In a closed configuration, power connector 216 electrically connects first printed circuit board 202 and second printed circuit board 206 and one or more grounding springs 220 provide a path to ground between second printed circuit board 206 and vapor chamber 210 or between vapor chamber 210 and first printed circuit board 202. In a closed configuration, retention feature 224 engages first printed circuit board 202 to second printed circuit board 206, wherein flexible interconnect 208, power connector 216, grounding springs 220 and retention feature 224 may maintain a separation distance between first printed circuit board 202 and second printed circuit board 206 to accommodate vapor chamber 210.

PCB assembly 200 may provide the functionality of a single PCB design in either an open configuration or a closed configuration. In a closed configuration, PCB assembly 200 may provide the functionality of single board designs, but in a reduced area for smaller chassis and may contribute to improved thermal environments in chassis.

Board Architecture Based on Components

The layout of components 204 on first printed circuit board 202 and second printed circuit board 206 may depend on the number, dimensions and types of components 204. For example, components 204 positioned on first printed circuit board 202 and second printed circuit board 206 may have different heights, wherein the position of components 204 on first printed circuit board 202 and second printed circuit board 206 may be selected to ensure components 204 do not contact other components 204 when PCB assembly 200 is in the closed configuration. For example, components 204-1, 204-2, 204-3 and 204-4 may be positioned on first printed circuit board 202 and components 204-5, 204-6 and 204-7 may be positioned on second printed circuit board 206 to ensure components 204-1, 204-2, 204-3 and 204-4 do not contact components 204-5, 204-6 and 204-7 when PCB assembly 200 is in a closed configuration.

Components 204 having a larger height may be at a position on first printed circuit board 202 to avoid contact between first printed circuit board 202 and components 204-5, 204-6 and 204-7 on second printed circuit board 206, between second printed circuit board 206 components 204-1, 204-2, 204-3 and 204-4 on first printed circuit board 206 and second printed circuit board 206, between components 204-1, 204-2, 204-3 and 204-4 with components 204-5, 204-6 and 204-7 when PCB 200 is in a closed configuration. For example, first printed circuit board 202 may be formed with a first printed circuit board length greater than a second printed circuit board length of second printed circuit board 206 and component 204-1 may be positioned on first printed circuit board 202 such that second printed circuit board 206 and components 204 on second printed circuit board 206 do not contact component 204-1 when PCB 200 is in a closed configuration.

Vapor Chamber Design to Accommodate Components

Still referring to FIGS. 2, 3A and 3B, vapor chamber 210 may be configured for positioning between first printed circuit board 202 and second printed circuit board 206 to remove heat from first printed circuit board 202 and second printed circuit board 206. Vapor chamber 210 may be formed with a vapor chamber length greater than a first printed circuit board length or a second printed circuit board length. Vapor chamber 210 may be formed based on components 204 on first printed circuit board 202 and second printed circuit board 206. For example, referring to FIGS. 2 and 3B, in some embodiments, vapor chamber 210 having a vapor chamber length greater than a first printed circuit board length or a second printed circuit board length may be formed with bend 218 to accommodate component 204-1 having a height greater than a maximum height. Vapor chamber 210 may be formed based on couplings or connectors of PCB 200. For example, referring to FIGS. 2 and 3B, in some embodiments, vapor chamber 210 may be formed with cutouts 219 to accommodate communications port 204-7, power connectors 216 and retention features 224, described in greater detail below.

Maintaining a Circuit Board Assembly in a Closed Configuration

Figure 4:
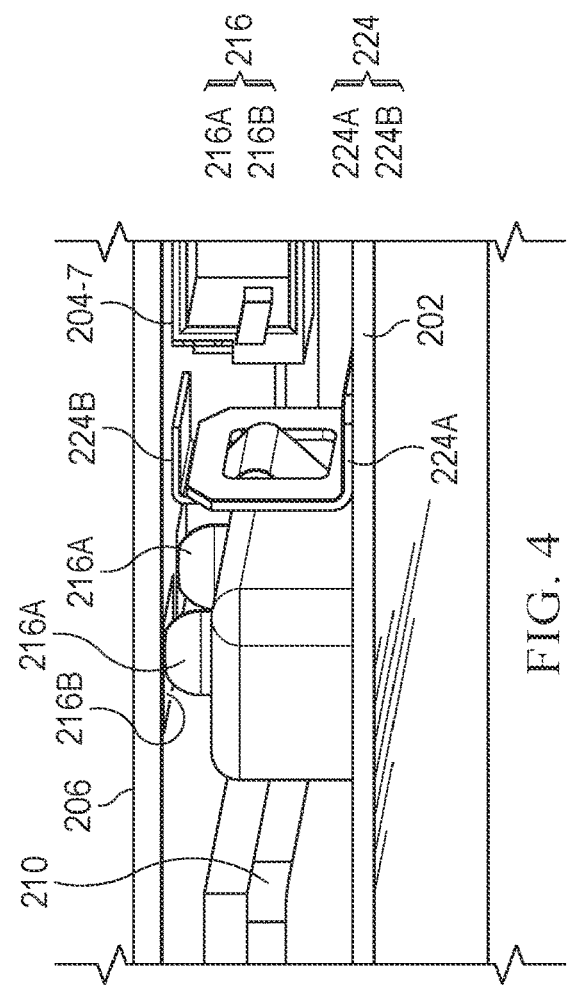
FIG. 4 is a closeup partial perspective view of a power connector for supplying power from the first printed circuit board to the second printed circuit board of the embodiment of a PCB assembly depicted in FIG. 3B.

Embodiments may ensure PCB assembly 200 is maintained in a closed configuration as depicted in FIG. 3B such that second printed circuit board 206 can receive electric power from first circuit board 202 while accommodating vapor chamber 210 and protecting components 204, for improved grounding of components 204 and improved cooling. FIG. 4 depicts a close up partial perspective view of PCB assembly 200 in a closed configuration with power connector 216 for transmitting electric power from first printed circuit board 202 to second printed circuit board 206 and retention feature 224 for maintaining circuit board assembly 200 in the closed configuration. Embodiments may benefit from operating in a closed configuration such as depicted in FIG. 3B. To ensure PCB assembly 200 remains in a closed configuration, PCB assembly 200 may include one or more retention features 224 such as depicted in FIG. 4. As depicted in FIG. 4, retention feature 224 may comprise first tab 224A and second tab 224B, wherein interaction between first tab 224A and second tab 224B may maintain a distance between first printed circuit board 202 and second printed circuit board 206, discussed below in greater detail.

Referring to FIG. 4, embodiments comprise retention features 224 to engage second printed circuit board 206 with first printed circuit board 202, ensure second printed circuit board 206 is able to receive electric power from first printed circuit board 202 via power connector 216 and ensure multiple paths to ground from second printed circuit board 206 to first printed circuit board 202 via grounding springs 220. In some embodiments, first printed circuit board 202 comprises first tab 224A of retention feature 224 and second printed circuit board 206 comprises second tab 224B of retention feature 224. In some embodiments, retention feature 224 comprises a snap coupling, wherein first tab 224A or second tab 224B is configured with a resilient material. In some embodiments, pushing second printed circuit board 206 towards first printed circuit board 202 causes initial contact between first tab 224A and second tab 224B. When first tab 224A is in contact with second tab 224, subsequently pushing second printed circuit board 206 towards first printed circuit board 202 may cause deflection of first tab 224A relative to second tab 224B, wherein subsequent pushing on second printed circuit board 206 toward first printed circuit board 202 moves first tab 224A past second tab 224B and second tab 224 is able to return to a substantially non-deflected state to engage first tab 224A with second tab 224B. In some embodiments, retention feature 224 may maintain PCB assembly 200 in a closed configuration by preventing second printed circuit board 206 from rotating relative to first printed circuit board 202.

Power Distribution

FIG. 4 depicts a close up partial perspective view of PCB assembly 200 with power connector 216 for transmitting electric power from first printed circuit board 202 to second printed circuit board 206. As depicted in FIG. 4, first part 216A of power connector 216 may include pogo pins and second part 216B may comprise conductive surfaces for conducting electric power from first printed circuit board 202 to second printed circuit board 206, discussed below in greater detail.

Referring to FIGS. 3A-3B and 4, first printed circuit board 202 comprises one or more cable connectors 212 for coupling information handling system 100 to a power source and an external network (not shown). In some embodiments, cable connector 212-1 may be configured to receive electric power from power cable 214-1 and cable connector 212-2 may be configured for receiving and sending signals over network cable 214-2. Flexible interconnect 208 connects second printed circuit board 206 to first printed circuit board 202 such that at least a portion of the electric power received by first printed circuit board 202 is supplied to second printed circuit board 206 and second printed circuit board 206 is communicatively coupled to first printed circuit board 202.

Supplying all electric power from first printed circuit board 202 to second printed circuit board 206 through flexible interconnect 208 may be undesirable due to heat generation and routing architecture. Accordingly, at least a portion of electric power from first printed circuit board 202 to second printed circuit board 206 may be transmitted through one or more power connectors 216. Referring to FIGS. 2, 3A-3B and 4, first printed circuit board 202 comprises first part 216A of power connector 216 and second printed circuit board 206 comprises second part 216B of power connector 216. In some embodiments, power connector 216 comprises a pogo pin type connection, wherein first part 216A comprises a set of pogo pins formed with a spring or resilient material and second part 216B comprises an electric contact area, wherein first part 216A maintains contact between the pogo pins and the electric contact area of second part 216B to form a continuous electric connection when PCB assembly 200 is in a closed configuration.

Electric Power and Interference with Components

Figure 5:
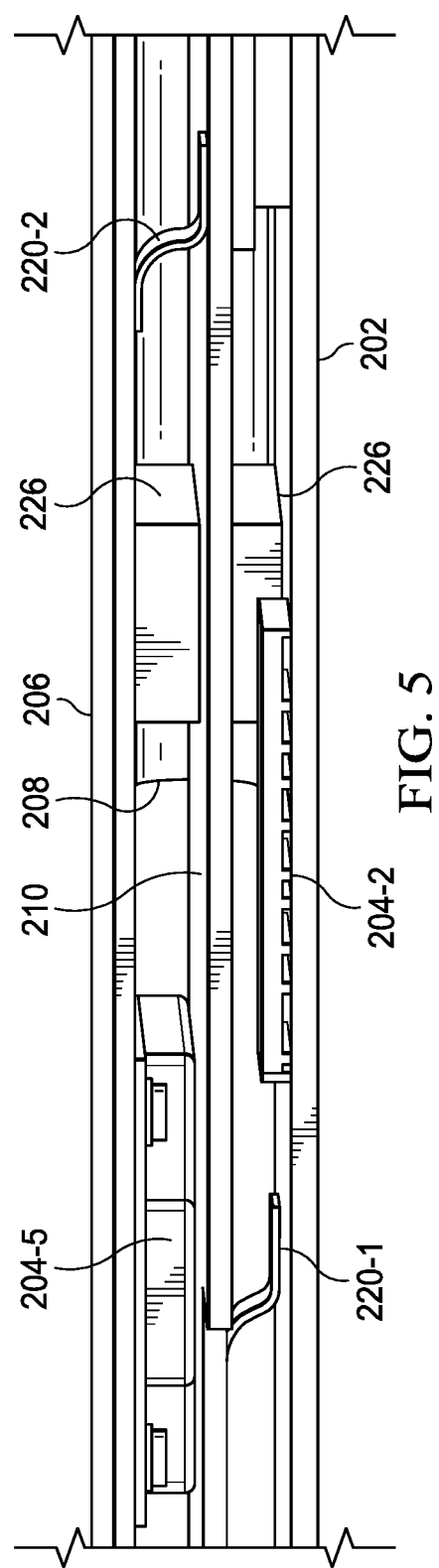
FIG. 5 is a closeup partial side view of the embodiment of a PCB assembly with a flexible interconnect depicted in FIG. 3B.

A component 204 may be adversely affected in the presence of interference. Referring to FIG. 5, component 204-5 may be an antenna or other component 204 that could be adversely affected in the presence of interference, particularly interference caused by electric power transmitting through PCB assembly 200. Grounding springs 220 may be positioned relative to components 204 to reduce interference or provide a path to ground components 204 or printed circuit boards 202 and 206 and vapor chamber 210. Referring to FIGS. 2, 3A-3B and 5, embodiments disclosed herein may comprise a PCB assembly 200 configured to reduce interference associated with certain components 204. Reducing interference may involve grounding second printed circuit board 206 to vapor chamber 210 to prevent interference from affecting component 204-5. Reducing interference may involve grounding second printed circuit board 206 to vapor chamber 210 and grounding vapor chamber 210 to first printed circuit board 202 to provide a path to ground. Embodiments may be configured with grounding features to reduce noise near selected components 204 on first printed circuit board 202 and second printed circuit board 206. Referring to FIGS. 2, 3A-3B and 5, first printed circuit board 202 may be coupled to a first end of grounding spring 220-1, wherein a second end of grounding spring 220-1 is in contact with vapor chamber 210 when vapor chamber 210 is positioned in PCB assembly 200. In some embodiments, second printed circuit board 206 may be coupled to a first end of grounding spring 220-2, wherein a second end of grounding spring 220-2 is in contact with vapor chamber 210 when vapor chamber 210 is positioned in PCB assembly 200. In some embodiments, one or more grounding springs 220 may be positioned near components 204 to form a faster or shorter path to ground to reduce noise associated with components 204 on PCB assembly 200. For example, as depicted in FIG. 5, grounding spring 220-1 may be positioned relative to component 204-5, operating as an antenna for example. Other components 204 such as component 204-2 may be less affected by interference or be a source of interference. In some embodiments, grounding strap 220-1 may be positioned between component 204-2 and component 204-5 to prevent interference from component 204-2 from affecting component 204-5.

Structural Support

Referring to FIGS. 3B, 4 and 5, when PCB assembly 200 is in a closed configuration, one or more of flexible interconnect 208, power connector 216, grounding springs 220, retention features 224 and spacers 226 may provide structural support to second printed circuit board 206 and PCB assembly 200.

As mentioned above, flexible interconnect 208 may couple second printed circuit board 206 with first printed circuit board 202 to supply at least a portion of the electric power to second printed circuit board 206 and enabling communication between first printed circuit board 202 and second printed circuit board 206. In addition to providing a conduit for electric power and communication, flexible interconnect 208 may be formed with a rigidity to maintain a separation distance between first printed circuit board 202 and second printed circuit board 206.

As mentioned above, power connector 216 may be configured to supply at least a portion of the electric power to second printed circuit board 206. Referring to FIGS. 3B and 4, in some embodiments, first part 216A comprises a spring or other resilient material such that, when PCB assembly 200 is in a closed configuration, first part 216A is compressed to apply a small force to maintain contact between first part 216A and second part 216B. A small reaction force applied by a spring or resilient material in first part 216A of power connector 216 on second part 216B may bias second printed circuit board 206 away from first printed circuit board 202 to maintain a minimum separation distance between first printed circuit board 202 and second printed circuit board 206.

Referring to FIGS. 3B and 5, n some embodiments, PCB assembly 200 comprises grounding spring 220 configured to maintain contact between vapor chamber 210 and first printed circuit board 202 or contact between vapor chamber 210 and second printed circuit board 206 when PCB assembly 200 is in a closed configuration. In some embodiments, grounding springs 220 may be deflected in the closed configuration to ensure a good electric connection between vapor chamber 210 and first printed circuit board 202 and between vapor chamber 210 and second printed circuit board 206. A small reaction force on second printed circuit board 206 by grounding springs 220 may bias second printed circuit board 206 away from first printed circuit board 202 to maintain a minimum separation distance between first printed circuit board 202 and second printed circuit board 206.

Referring to FIGS. 3B and 5, in some embodiments, PCB assembly 200 comprises one or more spacers 226 for maintaining a minimum distance between first printed circuit board 202 and vapor chamber 210 and between vapor chamber 210 and second printed circuit board 206. Spacer 226 may be formed from a resilient material. In some embodiments, spacers 226 may be formed from electrically insulating material, wherein spacers 226 may restrict electricity and grounding springs 220 may define a path to ground for reduced interference that could affect components 204.

Airflow Control for Thermal Management

Flexible interconnect 208 may affect the flow of air over components 204. Referring to FIG. 3B, vapor chamber 210 may be configured to extend beyond first printed circuit board 202 and/or second printed circuit board 206, wherein the portion of vapor chamber 210 extending beyond first printed circuit board 202 and/or second printed circuit board 206 may be positioned in an airflow flowing substantially perpendicular to PCB assembly 200.

In some embodiments, PCB assembly 200 may be configured to utilize flexible interconnect 208 as an airflow guide. In some embodiments, when PCB assembly 200 is in a closed configuration, flexible interconnect 208 may form an airflow guide to control airflow flowing along the length of first printed circuit board 202 and second printed circuit board 206 to cool PCB assembly 200. For example, vapor chamber 210 may be formed without bends 218 and flexible interconnect 208 connecting first printed circuit board 202 and second printed circuit board 206 may form part of an airflow channel to ensure airflow between first printed circuit board 202 and second printed circuit board 206 flows substantially parallel to the length of PCB assembly 200. In some embodiments (not shown), spacer 226 or some other feature may be positioned on first printed circuit board 202 or second printed circuit board 206 opposite flexible interconnect 208 and parallel to a length of PCB assembly 200 as a second airflow guide, wherein flexible interconnect 208 and spacer 226 form an airflow channel to ensure airflow between first printed circuit board 202 and second printed circuit board 206 flows substantially parallel to the length of PCB assembly 200.

The above disclosed subject matter is to be considered illustrative, and not restrictive, and the appended claims are intended to cover all such modifications, enhancements, and other embodiments which fall within the true spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

The invention claimed is:

1. A printed circuit board assembly, comprising:
   a first printed circuit board comprising:
      a first plurality of components;
      a power cable connector for receiving external power;
      a first part of a power connector; and
      a first part of a retention feature;
   a second printed circuit board comprising:
      a second plurality of components; and
      a second part of the power connector; and
      a second part of the retention feature;
   a flexible interconnect connecting the second printed circuit board to the first printed circuit board; and
   a vapor chamber positioned between the first printed circuit board and the second printed circuit board, wherein:
   in a closed configuration, the first part of the retention feature is connected to the second part of the retention feature to maintain a separation distance between the first printed circuit board and the second printed circuit board; and
   the first part of the power connector is connected to the second part of the power connector, wherein the flexible interconnect is configured to supply a first portion of the electric power from the first printed circuit board to the second printed circuit board and the power connector is configured to supply a second portion of the electric power from the first printed circuit board to the second printed circuit board.

2. The PCB assembly of claim 1, comprising:
   a grounding spring having a first end coupled to one of the first printed circuit board and the second printed circuit board, wherein in the closed configuration, a second end of the grounding spring is in contact with the vapor chamber.

3. The PCB assembly of claim 1, wherein the vapor chamber comprises one or more of a bend and a cutout based on a component of one or more of the first plurality of components and the second plurality of components.

4. The PCB assembly of claim 1, wherein the vapor chamber extends a length greater than a length of one or more of the first printed circuit board and the second printed circuit board for positioning in an airflow.

5. The PCB assembly of claim 1, wherein:
   the flexible interconnect comprises a first airflow guide on a first edge of the printed circuit board assembly;
   a second airflow guide is formed on a second edge of the printed circuit board assembly; and
   the flexible interconnect and the second airflow guide form an airflow channel for guiding airflow along a length of the printed circuit board assembly.

6. The PCB assembly of claim 5, wherein the second airflow guide comprises a spacer.

7. The PCB assembly of claim 1, wherein one or more of the flexible interconnect, the power connector and the grounding spring maintain a minimum separation distance between the first printed circuit board and the second printed circuit board.

8. A method of manufacturing a PCB assembly, comprising:
   forming a first printed circuit board comprising a first plurality of components, a power cable connector configured to receive electric power, a first part of a power connector and a first part of a retention feature;
   forming a second printed circuit board with a second plurality of components, a second part of the power connector and a second part of the retention feature;
   coupling a first end of a flexible interconnect to the first printed circuit board and a second end of the flexible interconnect to the second printed circuit board in an open configuration;
   positioning a vapor chamber relative to the first printed circuit board in the open configuration; and
   rotating the second printed circuit board relative to the first printed circuit board to configure the PCB assembly in a closed configuration, wherein in the closed configuration:
   the first part of the retention feature is connected to the second part of the retention feature to maintain a separation distance between the first printed circuit board and the second printed circuit board; and
   the first part of the power connector is connected to the second part of the power connector such that the flexible interconnect is configured to supply a first portion of the electric power from the first printed circuit board to the second printed circuit board and the power connector is configured to supply a second portion of the electric power from the first printed circuit board to the second printed circuit board.

9. The method of claim 8, comprising forming a grounding spring on one of the first printed circuit board and the second printed circuit board in the open configuration, wherein in the closed configuration a first end of the grounding spring is in contact with the one of the first printed circuit board and the second printed circuit board and a second end of the grounding spring is in contact with the vapor chamber.

10. The method of claim 8, wherein forming the grounding spring on one of the first printed circuit board and the second printed circuit board comprises connecting the first end of the grounding spring at a location based on a component on the one of the first printed circuit board and the second printed circuit board.

11. The method of claim 8, wherein positioning the vapor chamber comprises forming the vapor chamber with one or more of a bend and a cutout based on a component of the first plurality of components and the second plurality of components.

12. The method of claim 8, wherein positioning the vapor chamber comprises forming the vapor chamber with a length greater than a length of one or more of the first printed circuit board and the second printed circuit board.

13. The method of claim 8, wherein forming the first printed circuit board comprises:
   forming the first printed circuit board with a length greater than a length of the second printed circuit board, wherein in the closed configuration the second printed circuit board does not overlap a portion of the first printed circuit board; and
   positioning one or more components of the plurality of components on the portion of the first circuit board that the second printed circuit board does not overlap.

14. The method of claim 8, wherein forming the second printed circuit board comprises:
   forming the second printed circuit board with a length greater than a length of the first printed circuit board, wherein in the closed configuration a portion of the second printed circuit board does not overlap the first printed circuit board; and
   positioning one or more components of the plurality of components on the portion of the second circuit board that does not overlap the first printed circuit board.

15. An information handling system, comprising:
a printed circuit board assembly, comprising:
a first printed circuit board comprising:
- a first plurality of components;
- a power cable connector for receiving external electric power;
- a first part of a power connector; and
- a first part of a retention feature;

a second printed circuit board comprising:
- a second plurality of components; and
- a second part of the power connector; and
- a second part of the retention feature;

a flexible interconnect connecting the second printed circuit board to the first printed circuit board; and a vapor chamber positioned between the first printed circuit board and the second printed circuit board, wherein:

in a closed configuration, the first part of the retention feature is connected to the second part of the retention feature to maintain a separation distance between the first printed circuit board and the second printed circuit board; and the first part of the power connector is connected to the second part of the power connector such that the flexible interconnect is configured to supply a first portion of the electric power from the first printed circuit board to the second printed circuit board and the power connector is configured to supply a second portion of the electric power from the first printed circuit board to the second printed circuit board.

16. The information handling system of claim 15, further comprising a fan for generating an airflow perpendicular to a length of the printed circuit board assembly wherein the vapor chamber extends a length greater than a length of one or more of the first printed circuit board and the second printed circuit board for positioning in the airflow.

17. The information handling system of claim 15, further comprising a fan for generating an airflow relative to a length of the printed circuit board assembly, wherein:
- the flexible interconnect comprises a first airflow guide on a first edge of the printed circuit board assembly;
- a second airflow guide is formed on a second edge of the printed circuit board assembly; and
- the flexible interconnect and the second airflow guide form an airflow channel for guiding the airflow along the length of the printed circuit board assembly.

18. The information handling system of claim 17, wherein one or more of the flexible interconnect, the power connector and a grounding spring maintain a minimum separation distance between the first printed circuit board and the second printed circuit board.

19. The information handling system of claim 17, wherein the second airflow guide comprises a spacer.

20. The method of claim 8, wherein: rotating the second printed circuit board relative to the first printed circuit board to configure the PCB assembly in the closed configuration configures the flexible interconnect as a first airflow guide on a first edge of the PCB assembly; and the method further comprises forming a spacer on a second edge of the PCB assembly.

\* \* \* \* \*